United States Patent [19]
Hayes et al.

[11] Patent Number: 5,716,457
[45] Date of Patent: *Feb. 10, 1998

[54] CLEANING WITH SOLVATING AND RINSING AGENTS

[75] Inventors: Michael E. Hayes; Donald P. Hosman, both of Fernandina Beach; Kevin R. Hrebenar, Jacksonville; Robert D. Sell, Fernandina Beach, all of Fla.

[73] Assignee: Petroferm Inc., Fernandina Beach, Fla.

[*] Notice: The term of this patent shall not extend beyond the expiration date of Pat. No. 5,679,175.

[21] Appl. No.: 483,450

[22] Filed: Jun. 6, 1995

Related U.S. Application Data

[63] Continuation of Ser. No. 162,176, filed as PCT/US92/04992, Jun. 15, 1992, which is a continuation-in-part of Ser. No. 849,480, Mar. 11, 1992, abandoned, which is a continuation-in-part of Ser. No. 715,600, Jun. 14, 1991, abandoned.

[51] Int. Cl.$^6$ .................................................. B08B 3/00
[52] U.S. Cl. .................. 134/26; 134/30; 134/31; 134/38; 134/40
[58] Field of Search .................. 134/2, 26, 30, 134/31, 38, 40, 42, 105, 108, 184; 252/170, 171, 172

[56] References Cited

U.S. PATENT DOCUMENTS

| | | |
|---|---|---|
| 3,460,990 | 8/1969 | Barday . |
| 3,658,708 | 4/1972 | Ratto . |
| 3,715,438 | 2/1973 | Huggett . |
| 3,840,667 | 10/1974 | Huggett . |

(List continued on next page.)

FOREIGN PATENT DOCUMENTS

| | | |
|---|---|---|
| 0350316 | 1/1990 | European Pat. Off. . |
| 0454490 | 10/1991 | European Pat. Off. . |
| 0475596 | 3/1992 | European Pat. Off. . |

(List continued on next page.)

OTHER PUBLICATIONS

Baxter, Bryan, British Aerospace Dynamics Ltd., *Industrial Trials of the Perfluorocarbon Isopropyl Alcohol Cleaning System* Session: Solvents (Precision Cleaning) International CFC and Halon Alternatives Conference (undated).

Slinn, D., and Baxter, B., *Alcohol Cleaning Under a Non–Flammable Perflurocarbon Vapour Blanket*, pp. 1810 and 1815 (undated).

(List continued on next page.)

*Primary Examiner*—Jill Warden
*Assistant Examiner*—Alexander Markoff
*Attorney, Agent, or Firm*—Synnestvedt & Lechner

[57] ABSTRACT

A process for removing soil from a substrate which includes the use of a liquid cleaning composition comprising a solvating agent (for example, a monobasic ester) and a rinsing agent (for example, a perfluorocarbon), the solvating agent having:

(i) a room temperature vapor pressure of no greater than about 40 mm Hg; and (ii) a solvating strength of no less than about 10; and the rinsing agent having:

(iii) a room temperature vapor pressure of about 8 mm Hg to about 760 mm Hg; and (iv) an ozone depleting factor of no greater than about 0.15;

wherein the ratio of the vapor pressure of said rinsing agent to the vapor pressure of said solvating agent is at least about 20 and such that, at the boiling temperature of the composition, the vapor space above the boiling composition would comprise said rinsing agent and be substantially free of said solvating agent, the preferred process including immersing an article (for example, a printed circuit board having thereon solder flux) in the boiling composition, withdrawing the article from the composition and transferring it through the vapor space and into a container of relatively cool liquid rinsing agent from which it is withdrawn and transferred through vaporized rinsing agent and dried, and apparatus for carrying out the process.

21 Claims, 1 Drawing Sheet

U.S. PATENT DOCUMENTS

| | | |
|---|---|---|
| 3,881,949 | 5/1975 | Brock . |
| 3,904,430 | 9/1975 | Tipping et al. . |
| 3,956,162 | 5/1976 | Lautenberger . |
| 3,957,531 | 5/1976 | Tipping et al. . |
| 4,150,493 | 4/1979 | Slinn et al. . |
| 4,169,807 | 10/1979 | Zuber . |
| 4,276,186 | 6/1981 | Bakos et al. . |
| 4,745,690 | 5/1988 | Koop et al. . |
| 4,788,043 | 11/1988 | Kagiyama et al. ............ 134/11 |
| 4,822,429 | 4/1989 | McCord . |
| 4,828,751 | 5/1989 | Kremer . |
| 4,906,304 | 3/1990 | Buchwald et al. . |
| 4,947,881 | 8/1990 | Magid et al. . |
| 5,011,620 | 4/1991 | Dishart et al. . |
| 5,023,010 | 6/1991 | Merchant . |
| 5,031,648 | 7/1991 | Lutener et al. . |
| 5,055,138 | 10/1991 | Slinn . |
| 5,059,728 | 10/1991 | Li et al. . |
| 5,062,988 | 11/1991 | Dishart et al. . |
| 5,076,956 | 12/1991 | Anton . |
| 5,082,503 | 1/1992 | Sluga et al. . |
| 5,096,501 | 3/1992 | Dishart et al. . |
| 5,104,454 | 4/1992 | Yokozawa ............... 134/11 |
| 5,128,057 | 7/1992 | Bixenman et al. . |
| 5,183,067 | 2/1993 | Slinn . |
| 5,395,548 | 3/1995 | Pfahl, Jr. et al. . |

FOREIGN PATENT DOCUMENTS

| | | |
|---|---|---|
| 63-311538 | 9/1988 | Japan . |
| 2220951 | 1/1990 | United Kingdom . |
| 9111269 | 8/1991 | WIPO . |

OTHER PUBLICATIONS

*Ultrasonic Power Services Ltd. Clean 2000 System: The Alternative to "CFC" Cleaning and Drying*, pp. 1–10 (undated).

Wolf, George C., *Cleaning and Electronic Assemblies*, Journal: Res. Discl., vol. 323, p. 208 (1991).

Ellis, B.N., *Cleaning and Contamination of Electronics Components and Assemblies*, 1986.

CLEANING WITH SOLVATING AND RINSING AGENTS

This is a continuation of application Ser. No. 08/162,176, filed as PCT/US92/04992 Jun. 15, 1992, which is a continuation in part of application Ser. No. 07/849,480, filed Mar. 11, 1992, now abandoned, which is a continuation in part of application Ser. No. 07/715,600, filed Jun. 14, 1991, now abandoned.

FIELD OF THE INVENTION

The present invention relates to processes for removing adherent soils from substrates. More specifically, the invention relates to effective cleaning processes which utilize non-azeotropic mixtures of solvating agents and rinsing agents.

The present invention provides cleaning methods having characteristics and features which are highly desirable in numerous and varied commercial applications. For example, most metallic components are treated with an oil or other processing agent during the fabrication process, and this oil must be removed before the component is installed in the finished product. It is also frequently required that excess rosin flux must be removed from printed circuit boards before the boards are acceptable for use. The present processes are adaptable for use in these and many other applications. Thus, although the present invention is described initially herein in connection with its applicability to the cleaning of printed circuit boards, it will be appreciated from a reading of the entire application that the invention has wider application.

Printed circuit boards typically consist of a rigid or flexible sheet of fiberglass-reinforced dielectric plastic having electrical contacts and conductors on one or both sides thereof. Electrical components are electrically connected to these connectors and/or contacts using any one of a number of soldering techniques. Most of the soldering techniques currently used in commercial manufacturing processes include the step of coating the entire circuit side of the printed circuit board, or at least a portion thereof, with a solder flux prior to carrying out the actual soldering step. Rosin flux is commonly used alone or in combination with activating amine-based additives, such as amine hydrochloride, to clean the conductive metal parts and to promote strong mechanical and electrical bond with the solder.

After the soldering process is complete, the presence of residual flux on the printed circuit board is detrimental to the operability of the electrical circuitry and components contained on the board. Accordingly, any residual flux present on the board must be removed.

REPORTED DEVELOPMENTS

The techniques used to remove adherent residues from printed circuit boards are numerous and varied, ranging from simple brushing of the board with solvent to relatively sophisticated emulsion cleaning. See Leonida, *Handbook of Printed Circuit Design, Manufacture, Components and Assembly*, Chapter 9, pp. 464–489 (1981). One of the most widely used cleaning techniques is known as vapor degreasing or vapor-liquid-vapor cleaning. According to this process, the printed circuit board is contacted in succession by: (1) relatively hot solvent-containing vapors; (2) by relatively cool solvent-containing liquid; and (3) finally by relatively hot solvent-containing vapor.

Equipment typically used in connection with vapor degreasing consists of a two-section tank. The first section of the tank contains boiling solvent and the second section of the tank contains relatively cool, non-boiling solvent. Refrigerated coils are provided in the vapor space above the boiling solvent, and solvent vapor condenses onto the coils and is transferred to the cold solvent in the second section of the tank. A certain portion of the cold liquid solvent is returned to the first section of the tank to maintain a sufficient quantity of boiling liquid solvent. The cleaning process typically proceeds by first introducing a relatively cold, soil-containing circuit board into the vapor space above the boiling solvent. Due to the temperature difference between the circuit board and the solvent vapor, solvent condenses on the printed circuit board and achieves a solvating action on the residual rosin fluxes. The condensed vapors and the rosin fluxes solvated thereby are allowed to return to the first section of the tank. After the desired amount of cleaning action has occurred, the board is then moved to the second section of the tank and immersed in the cold solvent, thereby cooling the board and effecting any final cleaning which may be desired. The relatively cool board is then introduced once again into the relatively hot vapor space, where condensing vapors perform a final rinse on the board. Such vapor-liquid-vapor cleaning processes are described on pages 475–477 of Leonida. According to the teachings of Leonida, vapor degreasing processes require solvents having a boiling point of below about 75° C. (167° F.).

The types of materials that have heretofore been used for the removal of residual fluxes from printed circuit boards are also numerous and varied. For example, chlorinated hydrocarbons, aliphatic hydrocarbons, alcohols, and terpenes are known rosin flux solvents. Because of their high vapor pressures and good solvating ability in the vapor state, chlorinated hydrocarbons, including chlorofluorocarbons, have been widely used in vapor degreasing type processes. However, chlorinated hydrocarbons are generally relatively poor solvents for any ionic residues which may be present on the printed circuit board or other substrate to be cleaned. See Leonida, page 466. For this and other reasons, chlorinated hydrocarbons in general, and chlorofluorocarbons in particular, have sometimes been used in combination with other low-boiling solvents.

Mixtures comprising chlorinated hydrocarbons and other low-boiling solvents have been suggested for use in vapor degreasing type processes. In general, however, the prior art has failed to suggest, and in some cases has even discouraged, the use of mixtures having components with widely different vapor pressures in vapor degreasing processes. This has been especially true for prior art directed to the use of solvent mixtures which include chlorinated hydrocarbons, as illustrated, for example, in U.S. Pat. No. 3,640,884—Scholfield et al:

> Although mixtures of solvents have been used for [removing rosin flux from printed circuit boards] they have the disadvantage that they boil over a range of temperatures and consequently undergo fractionation in vapor degreasing or ultrasonic applications which are open to the atmosphere.

(Col. 1, lines 47–51). Accordingly, Schofield requires the use of tetrachlordifluoroethane in the form of binary and ternary azeotropic mixtures for use as solvents in vapor degreasing processes. Other patents which disclose the use of azeotropic mixtures containing chlorinated hydrocarbons as solvents in vapor degreasing type cleaning processes are U.S. Pat. Nos. 3,960,746—Gorski; 3,733,218—Begun; and 4,062,795—Hutchinson.

While chlorinated hydrocarbons and mixtures containing chlorinated hydrocarbons have been used widely and with advantage as solvents in printed circuit board cleaning processes, the use of such materials has recently been strongly discouraged for environmental reasons. In particular, the use of chlorinated hydrocarbons, including chlorofluorocarbons, has been severely criticized by ecologists because the dispersal of such materials into the atmosphere has been found to damage the ozone layer. For this reason, the use of chlorinated hydrocarbons has been greatly restricted and, in some situations, prohibited entirely. Thus, despite their attractive solvency characteristics, chlorinated hydrocarbons are no longer the solvent of choice in vapor degreasing processes. Thus, a need now exists for an alternative to the typical prior art degreasing processes, which rely heavily on chlorinated hydrocarbons for effective cleaning.

SUMMARY OF THE INVENTION

Applicants have discovered cleaning processes in which adherent soils are effectively removed from substrates. In particular, the present processes generally comprise (a) contacting the substrate with a liquid solvating agent and, preferably simultaneously and/or subsequently, (b) contacting the substrate with a rinsing agent, the ratio of the vapor pressure of said rinsing agent to the vapor pressure of said solvating agent being relatively high, preferably no less than about 20.

According to one preferred aspect of the present invention, the contacting step (a) comprises contacting the substrate with a boiling liquid cleaning composition comprising the solvating agent and the rinsing agent described above. Because of the extreme difference in volatility between the solvating and rinsing agents, the solvating agent has a strong tendency to remain in the liquid phase, and the vapor space overlying the boiling liquid contains only very minor amounts of the solvating agent and relatively high concentrations of the rinsing agent. This is an extremely advantageous condition since the need to recover and recycle the solvating agent is minimized according to the preferred process of the present invention. Moreover, due to the relatively non-volatile nature of the solvating agent, concern about possible escape of harmful solvating materials into the atmosphere is substantially reduced or eliminated.

According to another preferred aspect of the invention, the contacting step (b) comprises contacting the substrate with a vapor comprising the rinsing agent. This step is especially preferred for use in connection with the preferred boiling liquid embodiment described above because in such embodiments the vapor space directly above the boiling liquid contains substantial concentrations of rinsing agent.

A particularly preferred embodiment of the present invention comprises a cleaning composition in which the solvating agent and the rinsing agent are immiscible with each other. Advantages associated with the use of such a composition are described below.

DETAILED DESCRIPTION OF THE INVENTION

Figure 1:
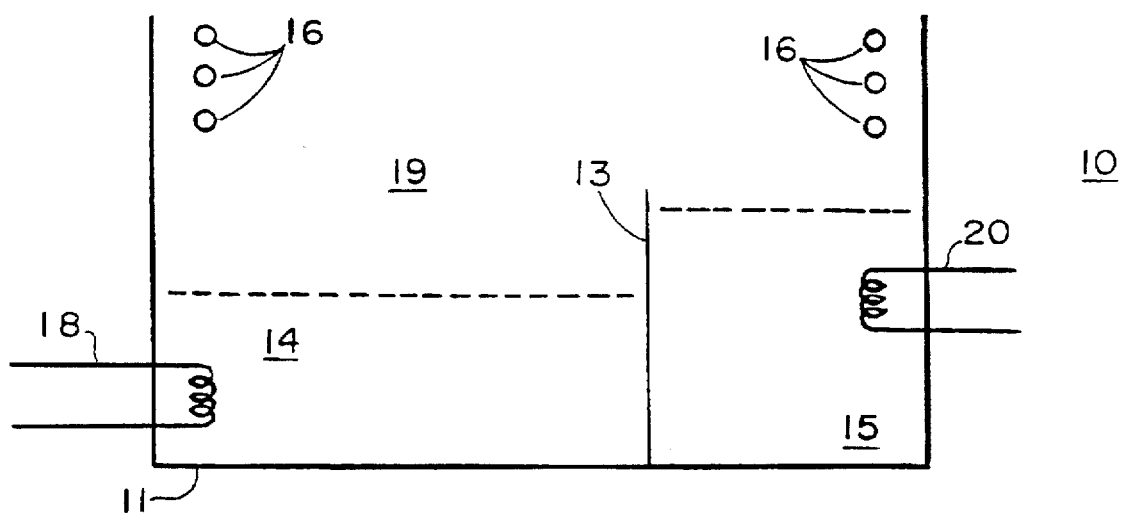
FIG. 1 is a semi-schematic view of a preferred apparatus used in connection with the present methods.

The present invention utilizes a combination of process steps and processing agents to effectively remove adherent soils from substrates. The term "substrate" is used herein in a broad sense to designate any device or article of manufacture which may be subject to contamination by unwanted materials. Thus, the term "substrate" encompasses, for example, machine parts, tools, component assemblies and printed circuit boards. Likewise, the term "adherent soil" is also used in a broad sense to designate, for example, unwanted materials which are not easily removed from the substrate by ordinary mechanical means. Thus, the term "adherent soil" encompasses inorganic and organic materials, for example, greases, waxes, oils, adhesives and rosin fluxes. Applicants contemplate, however, that the invention will find particular utility in connection with the cleaning of rosin fluxes from printed circuit boards and in connection with cleaning of wax, grease and/or oils from machine parts.

The present methods comprise the step of contacting the substrate to be cleaned with a liquid solvating agent. In this context, the term "solvating agent" refers to components or mixtures of components which have a strong tendency to solvate the adherent soil. The solvating agents of the invention preferably have a solvating power at room temperature of at least about 10, and even more preferably of at least about 20. Solvating power is determined by measuring the parts by weight of adherent soil dissolvable in 100 parts by weight of solvating agent at room temperature. According to especially preferred embodiments, the adherent residue is substantially fully miscible in the solvating agent in substantially all proportions.

An important feature of the present invention is the use of a solvating agent that has a relatively low vapor pressure. Applicants have discovered that the use of low vapor pressure solvating agents in combination with other preferred features of the present invention provides cleaning methods which are at once highly effective and environmentally benign. In particular, the low vapor pressure solvating agents have a strong tendency to remain in the liquid state. A principal disadvantage of prior chlorinated hydrocarbon solvents was the tendency of such compounds to escape into the environment. Furthermore, the strong tendency of the present solvating agents to remain in the liquid state greatly simplifies process design. Accordingly, in one embodiment of the present invention the solvating agents preferably have a room temperature vapor pressure of not greater than about 0.05 atmosphere (about 40 mm Hg), and even more preferably not greater than about 0.01 atmosphere (about 8 mm Hg). The term "room temperature" is used herein to indicate a temperature of about 70° F. (about 20° C.).

The solvating agent may also have other desirable features and characteristics. For example, the solvating agent preferably will not adversely affect the strength, integrity or operability of the materials of construction of the substrate or the components thereof. With respect to substrates comprising a printed circuit board, the solvating agent is preferably inert with respect to and not a solvent for epoxy resin impregnated fiberglass. The present solvating agents also preferably are low in viscosity to improve processing characteristics and low in toxicity to improve safety characteristics. It is highly preferred that the solvating agents of the present invention are benign to the atmosphere, soil and water. Chemical and photochemical stability are also other preferred features of the present solvating agents.

The solvating agent of the present invention is preferably selected from the group consisting of terpenes, dibasic esters, monobasic esters, petroleum solvents, alkyl substituted 2-pyrrolidones, ketones, ethers, alcohols, amines and mixtures of two or more of the aforementioned, with terpenes being preferred for adherent soils comprising rosin flux. While it is contemplated that all terpene and terpene-based compounds are adaptable for use as solvating agents according to the present invention, it is especially preferred that the solvating agent be selected from the group consisting of alpha pinene, beta pinene, gamma terpinene, delta-3-carene, limonene, dipentene, terpinolene and a mixture of two or more of the aforementioned, with limonene and dipentene being preferred. As will be seen from examples reported below, particularly good results have been achieved also with the use of organic esters.

The present methods also require contacting the substrate with a rinsing agent. As the term is used herein, rinsing agent refers to a component or mixture of components characterized by an ability to wash solvating agent, and any adherent residue dissolved thereby, from the substrate. Other characteristics of the rinsing agent will vary widely, depending upon factors such as substrate type and the solvating agent being used, and all such rinsing agents are within the scope of the present invention.

According to a preferred embodiment hereof, the rinsing agent has a vapor pressure at room temperature which is high relative to the vapor pressure at room temperature of the solvating agent. More particularly, it is preferred that the ratio of the vapor pressure of the rinsing agent to the vapor pressure of the solvating agent at room temperature be no less than about 20, and even more preferably no less than about 100. In another preferred embodiment of the invention, the room temperature vapor pressure of the rinsing agent is preferably from about 0.01 atmosphere (about 8 mm Hg) to about 1 atmosphere (about 760 mm Hg) and even more preferably from about 0.1 (about 80 mm Hg) to about 0.9 atmosphere (about 680 mm Hg). Applicants have found that rinsing agents having vapor pressures within the preferred ranges described above provide the present methods with beneficial characteristics. For example, the preferred methods do not require a prolonged drying step to remove the rinsing agent from the substrate. This advantageous feature is due, at least in part, to the use of high vapor pressure rinsing agents which tend to readily evaporate from the substrate, thereby leaving it clean and dry after the rinsing step. Rinsing agents having the preferred vapor pressure characteristics described herein possess other advantages when used according to the present methods, as described more fully hereinafter.

The present rinsing agents also preferably have little or no known tendency to cause depletion of the ozone layer. More particularly, it is highly preferred that the rinsing agents have an ozone depletion factor (ODP) of no greater than about 0.15, more preferably no greater than about 0.05, and even more preferably of about zero. Ozone depletion factors are reported in *Technical Progress On Protecting The Ozone Layer—Electronics, Degreasing and Dry Cleaning Solvents Technical Options Report*, United Nations Environment Programme (Jun. 30, 1989). Rinsing agents consisting of CFC-113, CFC-114 and CFC-115 have ozone depletion factors of greater than about 0.6 and are therefore not preferred according to the present invention.

As mentioned above and as described in detail below, it is particularly preferred that the solvating and rinsing agents be immiscible with each other. However, for some applications, it is preferred that the rinsing agent be substantially miscible with the solvating agent. According to preferred embodiments described in detail hereinafter, the articles to be cleaned are contacted with a cleaning composition that includes both the solvating agent and the rinsing agent together in the liquid state. In cleaning articles that are fragile and thus subject to being damaged if the composition is agitated unduly, the use of a cleaning composition in which the rinsing agent and the solvating agent are fully miscible in all proportions is desirable because such a composition can be used more effectively with little or no agitation than a composition that includes solvating and rinsing agents which are immiscible with each other.

It should be appreciated by those skilled in the art that the preferred rinsing agents are relatively benign to atmospheric ozone at least in part because of the absence or reduced presence of chlorine in the molecules making up the rinsing agent. However, it will also be appreciated that the reduced chlorine content results in a decrease in the ability of the rinsing agent to solvate many adherent soils, including rosin solder flux. Because of the other features and characteristics of the present invention, however, the relatively low solvating power of the preferred rinsing agents is not detrimental to the cleaning effectiveness of the methods of the present invention. Accordingly, the primary purpose of the present rinsing agents is to wash the solvating agent from the substrate to be cleaned, and it is not required that the rinsing agents have any ability to solvate the adherent soil, although this ability may be present in certain embodiments of the invention.

The rinsing agents of the present invention may also have other desirable and beneficial characteristics. For example, the rinsing agent preferably does not adversely affect the strength, integrity or operability of the materials of construction of the substrate of the components thereof. With respect to substrates comprising a printed circuit board, the rinsing agent is preferably inert with respect to and not a solvent for epoxy resin impregnated fiberglass. The present rinsing agents are also preferably low in toxicity and flammability to improve safety characteristics. It is also highly preferred that the rinsing agents of the present invention are benign to the atmosphere, soil and water. Chemical and photochemical stability are also other preferred features of the rinsing agents. Each of the characteristics noted above with respect to the rinsing agent is equally preferred for the rinsing composition as a whole.

The present rinsing agent is preferably selected from the group consisting of chlorinated hydrocarbons, chlorofluorocarbons, fluorocarbons, hydrofluorocarbons, hydrochlorofluorocarbons, aliphatic hydrocarbons, aromatic hydrocarbons, alcohols, ketones, ethers and mixtures of two or more of the aforementioned. It is even more preferred that the rinsing agent of the present invention be selected from the group consisting of mono- or di-chlorohydrocarbons, mono- or di-chlorofluorocarbons, fluorocarbons, aliphatic hydrocarbons, alcohols and mixtures of two or more of the aforementioned. As the term is used herein, aliphatic hydrocarbon refers to hydrocarbons comprising carbon and hydrogen and includes straight- and branch-chain and cyclic hydrocarbons and saturated and unsaturated hydrocarbons. As the terms are used herein, hydrofluorocarbon and fluorocarbon refer to fluorine-substituted hydrocarbons that do not contain chlorine. The use of perfluorohexane is preferred. Preferred among the alcohols are isopropanol and fluorinated alcohols such as pentafluoropropanol. Preferred among the hydrochlorofluorocarbons is dichloropentafluoropropane.

A particularly preferred embodiment of the invention comprises the provision of a cleaning composition in which the solvating agent and the rinsing agent are immiscible with each other. The term "immiscible" is used herein in its usual sense to mean that the liquid solvating agent and the liquid rinsing agent do not mix with each other. For example, when the two liquids are brought together, each forms its own layer, with the liquid having the higher specific gravity forming a layer which underlies an overlying layer of the liquid with lower specific gravity. Thus, a composition of this embodiment of the invention, in an undisturbed state, comprises stratified liquid phases. An advantage of the use of immiscible liquids is that the composition in use tends to boil at a relatively constant temperature which is substantially equivalent to the boiling temperature of the rinsing agent alone. In this connection, it is noted that the solvating agent is substantially insoluble in the rinsing agent, and typically, the soil removed from the treated substrate is also substantially insoluble in the rinsing agent—even at the elevated temperatures which may be used to boil the rinsing agent. Inasmuch as the solvating and rinsing agents can be miscible or immiscible with each other, it should be recognized that the present invention includes also within its scope a cleaning composition which comprises solvating and rinsing agents which are partially miscible in each other or partially immiscible with each other.

In a preferred embodiment, the liquid rinsing agent underlies the solvating agent in the stratified form of the composition. In such an embodiment, the relatively high-boiling solvating agent forms a protective cap or blanket over the lower boiling rinsing agent. This deters evaporative loss of the rinsing agent when the composition is not being used. An embodiment of the aforementioned type of composition can be provided by selecting a rinsing agent which has a higher specific gravity than that of the solvating agent.

It is especially preferred that the present rinsing agent be a non-aqueous rinsing agent. As the term is used herein, non-aqueous rinsing agent refers to those rinsing agents which contain only minor amounts, preferably less than five percent and even more preferably less than about one percent, of water. Substantially water-free rinsing agents are especially preferred. While aqueous systems have certain desirable characteristics, such as ready availability and low cost, rinsing agents containing water are frequently corrosive to one or more of the materials of construction of the substrate. Moreover, substrates which are rinsed with water-containing systems are difficult to dry. Thus, the use of water-containing rinsing agents has the detrimental characteristic of being potentially harmful to the substrate being cleaned and/or the components contained therein and of producing substrates which are difficult to dry. Accordingly, the use of rinsing agents or rinsing compositions which contain water is not preferred.

On the other hand, water may be used as a solvating agent in the practice of the present invention inasmuch as water is capable of dissolving many types of soils, including particularly inorganic soils. Water can be used by itself as a solvating agent or in combination with one or more other solvating agents. And it can be used to particular advantage in compositions which comprise immiscible constituents.

Excellent results have been achieved in a variety of cleaning applications employing solvating agents and rinsing agents, as described above. There may be, however, applications where improvements in cleaning may be realized by the use of a surfactant(s). Suitable surfactants can be selected based on knowledge in the art.

Many techniques are known and available to those skilled in the art for carrying out the contacting steps of the present invention, and the use of all such techniques is within the scope hereof. Thus, it is generally sufficient that the present contacting steps be carried out under conditions sufficient to achieve the objective of each step. That is, the step of contacting the substrate with a solvating agent preferably proceeds under conditions sufficient to solvate or loosen a predetermined type and amount of adherent soil from the substrate, while the step of contacting the substrate with a rinsing agent preferably proceeds under conditions sufficient to wash a predetermined amount of solvating agent from the substrate. It is contemplated, for example, that the step of contacting the substrate with the solvating agent may include brushing or spraying the substrate with the solvating agent until the predetermined extent of solvation and/or loosening is achieved. Nevertheless, applicants have found that certain effective and beneficial cleaning is achievable according to the preferred contacting conditions described below.

It is generally preferred that the contacting steps of the present invention comprise immersion of the substrate in a liquid or vapor containing the solvating agent and/or the rinsing agent. Furthermore, agitation of the substrate and/or agitation of the contacting medium is also preferred for the purpose of maximizing contact efficiency. In effect, maintaining relative movement between the composition and substrate tends to speed up soil removal. In use, it is highly recommended, and thus particularly preferred, that a composition comprising immiscible liquids be agitated. Agitation of the immiscible constituents of the composition results in the formation of a mixture thereof and causes the rinsing agent to be moved toward and to the surface of the heated composition where it vaporizes. The composition tends to boil more uniformly. Upon termination of the cleaning process, including terminating agitation of the composition, the immiscible liquids separate readily into two distinct layers as the composition cools below the boiling point of the rinsing agent. The soil removed from the treated part collects typically in the layer of solvating agent. Thus, contamination of the rinsing agent with soil can be avoided.

Also, in practice, the system may not have a flash point even if operated above the flash point of the high boiling agent. This will occur because the low boiler can be chosen to not have a flash point and in operation the low boiler will fill the equipment system with a non-combustible vapor phase.

With respect to the sequence of the contacting steps, it is contemplated that the step of contacting the substrate with the rinsing agent may be carried out substantially simultaneously with and/or subsequent to the step of contacting the substrate with the liquid solvating agent, subsequent contact being preferred according to certain embodiments.

The duration of the contacting steps of the present invention also may vary widely, depending upon a number of factors, such as the type and nature of the adherent soil, the materials of construction of the substrate and the extent of cleaning desired, and all such durations are within the scope of the present invention. Preferably, however, the step of contacting the substrate with solvating agent comprises maintaining the substrate in contact with the solvating agent for a time sufficient to solvate or at least loosen substantially all of the adherent soil from the substrate. It is contemplated that a person of ordinary skill in the art, with the guidance provided by the present disclosure, will be readily able to determine the appropriate contact time for any particular application without undue experimentation. It is especially preferred, however, that the substrate be contacted with the solvating agent for a period of from about 30 seconds to about 5 minutes, and even more preferably from about 30 seconds to about 2 minutes.

The step of contacting the substrate with rinsing agent preferably comprises contacting the substrate with rinsing agent for a period of time effective to wash from the substrate a major proportion, and preferably substantially all, of the solvating agent. Once again, it is contemplated that one of ordinary skill in the art, with the guidance provided by the present application, will be readily able to determine the exact contact time required for any specific application without undue experimentation. It is generally preferred, however, that the substrate be contacted with the rinsing agent for a period of from about 30 seconds to about 5 minutes, and even more preferably from about 30 seconds to about 3 minutes.

The use of contacting steps according to the duration periods described above are especially preferred for methods which comprise the removal of rosin solder flux from printed circuit boards, especially such methods which utilize a rinsing agent comprising chlorofluorocarbons, hydrochlorofluorocarbons, fluorocarbons or alcohols, and a solvating agent comprising a terpene or terpene-based material, or ester or ester-based material, for example, a monobasic or dibasic ester, the former being preferred.

The temperature and pressure conditions under which the contacting steps are carried out may also vary widely, depending upon numerous factors, such as the cost and availability of heating and cooling mediums, and all such variations are within the scope of the present invention. For the purposes of simplicity, it is generally preferred that the contacting steps be carried out at about ambient pressure conditions. With respect to temperature conditions, it is highly preferred that the step of contacting the substrate with a solvating agent comprise: (1) providing a solvating agent at a temperature of from about 10° C. (about 50° F.) to about 150° C. (about 300° F.), and even more preferably of from about 30° C. (about 80° F.) to about 120° C. (about 250° F.); and (2) contacting the substrate with provided solvating agent. It is also preferred that the invention comprise contacting the substrate with a boiling liquid comprising solvating agent, especially when such boiling occurs within the temperature ranges described above.

According to one preferred embodiment of the invention, the step of contacting the substrate with rinsing agent comprises contacting the substrate with vapor comprising rinsing agent, the temperature of the substrate being less than about the temperature of the vapor, preferably at least about 5° C. less than the temperature of the vapor. It is further preferred that the step of contacting the substrate with a rinsing agent comprises: (1) providing a rinsing agent at a temperature of from about 5° C. (about 40° F.) to about 120° C. (about 250° F.), and even more preferably from about 20° C. (about 70° F.) to about 100° C. (about 230° F.); and (2) contacting the substrate with the provided rinsing agent. Applicants have found that the effectiveness of the solvating and rinsing steps of the present invention is substantially improved when carried out under the temperature conditions described above.

With respect to the actual contact mechanism, it is contemplated that all known contacting techniques are adaptable for use according to the present methods. Thus, for the liquid solvating and rinsing agents, the contacting step may comprise, for example, spraying, brushing and/or immersing of the substrate, with immersion being preferred. For rinsing agents in the vapor state, the contacting step may comprise, for example, blowing rinsing agent vapors across the substrate and/or immersing the substrate in rinsing agent vapors, with immersion being preferred.

An especially preferred embodiment of the present methods comprises: (a) contacting the substrate with a boiling liquid composition comprising solvating agent and rinsing agent; and (b) contacting the substrate with a vapor comprising a major proportion by volume of rinsing agent and a minor proportion by volume of solvating agent, the ratio of the vapor pressure of said rinsing agent to the vapor pressure of said solvating agent being at least about 20. It has been found that this embodiment is highly preferred because it permits a simplified yet effective process design. According to certain embodiments, the use of a boiling liquid containing solvating agent establishes the preferred elevated temperature contact between the substrate and the solvating agent. Furthermore, the provision of a boiling liquid comprising a low vapor pressure solvating component and a high vapor pressure rinsing component results in the generation of a vapor space above the boiling liquid which comprises rinsing agent in major proportion and only minor amounts, if any, of solvating agent. Thus, the effective elimination of solvating agent from the vapor space coupled with the close proximity of the boiling liquid to the vaporous rinsing agent allows a simple and highly effective process design. In its most preferred form, the solvating and rinsing agents are immiscible with each other.

With particular reference now to FIG. 1, a batch mode cleaning process according to one embodiment of the present invention is illustrated. The methods according to this embodiment utilize a partitioned cleaning tank 10 having a first section 11 and a second section 12 separated by a partitioning member or weir 13. The first section 11 of tank 10 is filled to a first, predefined level with a liquid cleaning composition 14 comprising solvating agent, and the second section 12 is filled to a second predefined level above said first predefined level with a liquid rinsing composition 15 comprising rinsing agent. Condensing coils 16 are provided in the vapor space above the liquids contained in tank 10. The first section 11 of tank 10 is provided with heating coils 18 for adding heat to the liquid cleaning composition, and the second section 15 of tank 10 is provided with cooling coils 20 for removing heat from the liquid cleaning composition. For embodiments of the type illustrated in FIG. 1, it is especially preferred that the liquid cleaning composition 14 contained in the first tank section 11 comprise solvating agent and rinsing agent, with the solvating agent preferably being present in major proportion, preferably about 50 to about 80 percent by weight of the liquid cleaning composition, and the rinsing agent preferably being present in minor proportion, preferably from about 20 to about 40 weight percent of the liquid cleaning composition. Heating element 18 is preferably controlled to raise the temperature of the liquid cleaning composition to about the boiling point.

Overlying the liquids contained in section 11 and 12 of the cleaning tank is a vapor 19 which comprises the rinsing agent of the present invention. More particularly, as the temperature in tank section 11 is raised to the boiling point of the liquid cleaning composition 14, the rinsing agent contained therein is preferentially vaporized and fills the vapor space 19 of the cleaning tank 10. Coolant flow through condensing coil 16 is regulated so as to condense about the same amount of vapor as is produced by the boiling liquid contained in first tank section 11. Condensed liquid transfer means (not shown) deliver the condensed liquid into the second section 12 of tank 10. The proper level of cool, rinsing agent contained in the second tank section 12 is controlled by the height of partition member or overflow weir 13. Excess liquid rinsing agent flows over weir 13 and into the first tank section 11, thereby replenishing rinsing agent lost therefrom by vaporization.

One preferred embodiment of the present methods will now be described in connection with the use of the apparatus illustrated in FIG. 1 to clean a printed circuit board containing residual rosin solder flux. The first step comprises contacting the contaminated printed circuit board with solvating agent by immersing the board in the boiling liquid contained in first section 11 of tank 10, thereby solvating and/or loosening any residual rosin flux present on the board. The first contacting step preferably has a duration of about 1 to about 7 minutes. The next step comprises contacting the printed circuit board with rinsing agent so as to wash solvating agent, and any rosin flux dissolved therein or loosened thereby, from the circuit board. This second contacting step preferably comprises conducting two or more of the following steps substantially sequentially: (i) contacting the printed circuit board with rinsing agent by subjecting the board to the vapor space 19 overlying the liquid tank 10 substantially immediately upon removal of the board from contact with the solvating agent; (ii) further contacting the printed circuit board with rinsing agent by immersing the board in the relatively cool liquid rinsing agent contained in the second section of the tank 10; and (iii) further contacting the printed circuit board with rinsing agent by immersing the printed circuit board in the vapor space 19 overlying the liquid tank 10. This preferred sequence of contacting steps is believed to provide a highly effective technique for cleaning and drying substrates containing adherent soil.

The contacting step (i) described above is advantageous because it permits excess solvating agent and associated soil to be washed off the board and returned under the influence of gravity to the boiling liquid. Thus, contamination of the rinsing liquid contained in section 12 of tank 10 with solvating agent and/or removed soil is minimized. It is contemplated that for certain embodiments, contacting step (i) will provide acceptably clean and dry printed circuit boards. For more stringent requirements, however, it is preferred that the further contacting steps (ii) and (iii) be utilized. In particular, the printed circuit board is preferably removed from the vapor space above tank section 11 and immersed in the relatively cool rinsing composition contained in tank section 12. This further contacting step provides additional rinsing and also serves to cool the board, preferably to about the temperature of the liquid in tank section 12. The final step in this preferred embodiment comprises removing the printed circuit board from the cool rinsing liquid and contacting the printed circuit board once again with the relatively hot vapor contained in the vapor space 19. Because of the temperature differential, the rinsing agent in the vapor space will condense on the substrate, thereby providing a final rinse step and a clean, dry printed circuit board.

EXAMPLES

The following examples are illustrative and/or comparative but not limiting of the present invention. The designation of examples as comparative is not necessarily an indication that the examples represent prior art procedures.

Example 1

About 270 parts by weight (pbw) of a rinsing agent consisting of 1,1,1-trichloroethane and about 630 pbw of a solvating agent consisting of limonene were combined in a heated vessel to form a liquid cleaning composition consisting of about 70 percent by weight of limonene solvating agent and about 30 percent by weight of 1,1,1-trichloroethane rinsing agent. The liquid cleaner contained in the heated vessel was then brought to a boil, at which time the temperature of the liquid was about 140° C. The vapor space immediately overlying the boiling liquid consisted essentially of 1,1,1-trichloroethane and only trace amounts of limonene. Due primarily to heat loss through the uninsulated wall of the vessel, the temperature of the vapor space was about 66° C. below the temperature of the boiling liquid.

A 1"×2" rectangular metal test coupon having a thickness of about one-sixteenth of an inch was contaminated at about room temperature with cutting oil. The contaminated coupon was then placed in the vapor space above the boiling liquid, whereupon the 1,1,1-trichloroethane vapor contacted the coupon and condensed thereon. The coupon was held in the vapor space until the temperature of the coupon equilibrated with the temperature of the vapor space, as evidenced by a cessation of condensation forming on the coupon. The coupon was removed from the vapor, observed and found to be contaminated with cutting oil, thereby indicating that the step of contacting the coupon with vaporous rinsing agent was alone not sufficient to remove the substantially all of the contaminant from the coupon.

The still contaminated coupon was then contacted with limonene solvating agent by immersing the coupon in the boiling liquid for a time sufficient to solvate or loosen substantially all of the contaminant, that is about 45–60 seconds. The coupon was then removed from the boiling liquid and placed in a vessel containing liquid 1,1,1-trichloroethane at about room temperature for time sufficient to allow the coupon to be cooled to about room temperature, that is, about 60 seconds. Further contact with the rinsing agent was then achieved by again immersing the coupon in the vapor space immediately above the boiling liquid for a time sufficient to observe cessation of condensation on the coupon, that is, about 40–60 seconds, thereby contacting the coupon with a vapor consisting essentially of the rinsing agent 1,1,1- trichloroethane. The coupon was again removed from the vapor and found to be substantially dry and free of cutting oil contaminant and solvating agent.

Example 2

An apparatus of the general type illustrated in FIG. 1 was utilized to remove asphalt contaminant from a wire rod coated therewith, except that cooling coils 20 were not provided in the second section 12 of the vessel. A cleaning composition was prepared by combining about 270 parts by weight (pbw) of a rinsing agent consisting of isopropanol and about 630 pbw of a solvating agent consisting of limonene. The first section of the apparatus was charged with the liquid cleaning composition and the second section of the apparatus was charged with a liquid consisting essentially of isopropanol. The liquid cleaning composition was heated until boiling occurred. The temperature of the boiling cleaning liquid was about 92° C. The vapors rising from the boiling liquid were condensed and transferred to the second section of the apparatus at a rate sufficient to maintain a substantially constant liquid level in both the first and second sections thereof. The vapor space immediately overlying the boiling liquid consisted essentially of isopropanol and only trace amounts of limonene. Due primarily to heat loss through the uninsulated wall of the vessel, the temperature of the vapor space was about 9° C. below the temperature of the boiling liquid. The liquid in the second section of the tank was at a temperature of about 25°–40° C. and consisted essentially of isopropanol and only trace amounts of limonene.

A wire rod was coated with asphalt and then allowed to cool to about room temperature. The contaminated rod was then placed into the vapor space immediately above the boiling liquid for a time period sufficient to allow substantial cessation of condensation of the vapors on the rod, that is, about 40–60 seconds. The wire rod was then removed from the vapor space, observed and found to remain substantially contaminated with the asphalt. The wire rod was then passed through the vapor space and placed into the boiling liquid. The wire rod was held in the boiling liquid for about 60 seconds. Upon removal from the boiling liquid, the wire rod was found to be substantially free of asphalt, but wet with solvating agent.

The clean but wet wire rod was then immersed in the cool liquid rinsing agent for about 60 seconds. The rod was then placed in the vapor phase above the boiling liquid for a period sufficient to observe a cessation of condensation on the wire rod, that is, about 40–60 seconds. The wire rod was then again removed from the vapor and found to be both clean and dry.

Example 3

Example 2 was repeated, except that the contaminant was a high melting temperature wax. The wire rod was coated by dipping in molten wax and then allowed to cool to about room temperature. The coated wire rod was then placed into the vapor space immediately above the boiling liquid for a time period sufficient to allow a substantial reduction in the rate of condensation of the vapors on the rod, that is, about 20–30 seconds. The wire rod was then removed from the vapor space, observed and found to remain substantially contaminated with the wax, although softening of the wax had apparently occurred. The wire rod was allowed to cool and was then immersed in the boiling liquid for about 60 seconds. Upon removal from the boiling liquid, the coated wire rod was found to be substantially free of wax but wet with solvating agent.

The clean but wet wire rod was then immersed in the cool liquid rinsing agent for about 10–20 seconds. The rod was then immersed in the vapor phase above the boiling liquid for a period sufficient to observe a cessation of condensation on the wire rod, that is, about 40–60 seconds. The wire rod was then again removed from the vapor and found to be both clean and dry.

Example 4

An apparatus of the general type illustrated in FIG. 1 was utilized to remove Boscan crude oil from a wire rod coated therewith, except that the second section of the apparatus was not charged with rinsing liquid and condensed vapors were returned directly to the boiling cleaning liquid. The first section of the apparatus was charged with the liquid cleaning composition of Example 2. The liquid cleaning composition was heated until boiling occurred. The temperature of the boiling cleaning liquid was about 92° C. The vapors rising from the boiling liquid were condensed and returned to the boiling liquid. The vapor space immediately overlying the boiling liquid consisted essentially of isopropanol and only trace amounts of limonene. Due primarily to heat loss throughout the uninsulated wall of the vessel, the temperature of the vapor space was about 17° C. below the temperature of the boiling liquid.

A wire rod was coated with Boscan crude oil and allowed to cool to room temperature. The contaminated rod was then placed into the vapor space immediately above the boiling liquid for a time period sufficient to allow substantial cessation of condensation of the vapors on the rod, that is, about 40–60 seconds. A few drops of oil were then observed to fall from the contaminated wire hanger. The wire rod was then removed from the vapor space, observed and found to remain substantially contaminated with the crude oil. The wire rod was then immersed in the boiling liquid for about 30 seconds and then raised into the vapor space immediately above the boiling liquid. The wire rod was then held in the vapor space for a period of about 30 seconds, after which it was withdrawn from the apparatus and allowed to cool. The wire rod was observed to be substantially clean but slightly damp. The wire rod was then reimmersed in the vapor phase above the boiling liquid for a period sufficient to observe a cessation of condensation on the wire rod, that is, about 40–60 seconds. The wire rod was then again removed from the vapor and found to be both clean and dry.

Example 5

An apparatus of the general type illustrated in FIG. 1 was utilized to clean a polyamide resin contaminant from a wire rod coated therewith. A cleaning solution was prepared by combining about 270 pbw of a rinsing agent consisting of 1,1,1-trichloroethane and about 630 pbw of a solvating agent consisting of limonene. The first section of the apparatus was charged with the liquid cleaning composition and the second section of the apparatus was charged with a liquid consisting essentially of 1,1,1-trichloroethane. Heat was applied to the liquid until boiling occurred. The vapors rising from the boiling liquid were condensed and transferred to the second section of the apparatus at a rate sufficient to maintain a substantially constant liquid level in both the first and second sections thereof. The temperature of the boiling liquid was about 118° C., and the temperature of the cool liquid in the second section of the tank was about 25°–40° C. Due primarily to heat loss through the uninsulated wall of the vessel, the temperature of the vapor space was about 44° C. below the temperature of the boiling liquid. The vapor directly above the boiling liquid consisted essentially of 1,1,1-trichloroethane, with no more than trace amounts of limonene present.

A wire rod was coated by dipping in molten polyamide residue available from Union Camp under the designation UNI-REZ 2646 and then allowed to cool to about room temperature. The contaminated wire rod was then placed in the vapor space above the boiling liquid, whereupon the 1,1,1-trichloroethane vapor contacted the rod and condensed thereon. The wire rod was held in the vapor space for about one minute and then removed. No removal of contaminant from the rod was evident, thereby indicating that the step of contacting the wire rod with vaporous rinsing agent was alone not sufficient to remove the contaminant from the wire rod.

The still contaminated wire rod was then contacted with limonene solvating agent by immersing the rod in the boiling liquid for a time sufficient to solvate or loosen substantially all of the contaminant, that is, about six minutes. The wire rod was then removed from the boiling liquid and placed in the section of the apparatus containing the cool liquid 1,1,1-trichloroethane for about 60 seconds. Further contact with the rinsing agent was then achieved by again placing the rod in the vapor space immediately above the boiling liquid for a time sufficient to observe a substantial reduction in the rate of condensation on the rod, that is, about 40–60 seconds, thereby contacting the rod with a vapor consisting essentially of the rinsing agent 1,1,1-trichloroethane. The rod was again removed from the vapor and found to be substantially dry and free of resin contaminant and solvating agent.

The next group of examples (Examples 6 to 9 inclusive) illustrates the use of compositions which are within the scope of the present invention and which include solvating agents and rinsing agents which are immiscible with each other. The rinsing agent which was used in the composition of these examples is perfluorohexane ($C_6F_{14}$). Table 1 below contains information respecting various of the physical properties of perfluorohexane.

TABLE 1

| Properties of Perfluorohexane | |
| --- | --- |
| Basic Formula | $C_6F_{14}$ |
| Flash Point, °C. | None |
| Normal Boiling Point, °C. | 56 |
| Pour Point, °C. | −90 |
| Liquid Density, 25° C., gm/ml | 1.68 |
| Liquid Viscosity, 25° C., cp | 0.67 |
| Vapor Pressure, 25° C., mm Hg | 232 |
| Thermal Conductivity, w/(cm)(°C.) × $10^3$ | 0.57 |
| Specific heat, 25° C., cal/(gm)(°c.) | 0.25 |
| Heat of Vaporization @ b.P cal/gm | 21 |
| Coefficient of Thermal Expansion, 25° C. ml/(ml) (°C.) × $10^3$ | 1.6 |
| Surface Tension, 25° C., dynes/cm | 12 |
| Solubility of Water, 25° C., dynes/ppm | 10 |
| Ozone Depletion Potential (ODP) | zero |

Example 6

The composition of this example comprised 50 wt. % of isopropyl myristate (solvating agent) and 50 wt. % of perfluorohexane (rinsing agent). The individual components were placed in a vessel which was equipped with a stirrer and heater and to which a condenser was attached. The components were stirred to form a mixture which was heated to boiling to produce a steady reflux of the rinsing agent. A metal part was coated with a cutting oil and immersed for 1 to 2 minutes in the boiling composition which had a temperature of 138° F. (about 59° C.). The part was then withdrawn from the composition and raised above the vapor zone of the apparatus where it was allowed to cool to about room temperature. The cooled part was then lowered to the vapor zone where vapor of perfluorohexane condensed on the cooled part. The temperature of the vapor in the vapor zone was 136° F. which is the same temperature as the boiling temperature of perfluorohexane. .The part was kept in the vapor of the vapor zone for 5 to 7 minutes at which time liquid had stopped condensing on the part. The part was removed from the vapor zone and ascertained to be clean and dry.

Example 7

There was added to the composition of Example 6 an amount of cutting oil such that the composition contained 15 wt. % of oil (based on the total weight of the composition). The procedure described in Example 6 was re-run utilizing the composition with added oil. The results obtained were the same as those reported in Example 6 in terms of cleaning and drying. The temperatures of the boiling composition and of the vapor were also the same as those reported in Example 6. When the agitation and in-put of heat were terminated, the composition separated into two distinct layers. It was observed that the bottom layer consisted of the perfluorohexane which has a higher specific gravity than isopropyl myristate. The layer of perfluorohexane was clear and apparently uncontaminated with soil or cleaner. The upper layer of the composition comprised the isopropyl myristate which showed the distinct color of the cutting oil.

Example 8

The procedures described in Examples 6 and 7 above were re-run except that methyl caprate was substituted for isopropyl myristate. The results obtained were the same as those reported in Examples 6 and 7.

Example 9

The procedures described in Examples 6 to 8 above were repeated, except that the compositions were modified by including therein about 10 ppm of a non-ionic fluoro liquid surfactant sold by 3M Company under the trademark Fluorad FC-430 and characterized by 3M Company as fluoroaliphatic polymeric esters.

The cleaning results were the same as those described in Examples 6 to 8.

COMPARATIVE EXAMPLE A

A rinsing agent consisting of isopropanol was charged to a heated vessel at about atmospheric pressure and brought to a boil.

A wire rod was coated with asphalt and allowed to cool to about room temperature. The contaminated rod was immersed in the boiling liquid for about 60 seconds. Upon removal from the boiling liquid, no removal of asphalt from the rod was evident.

Another example of the practice of the present invention involved the use of a cleaning composition which comprised "immiscible" solvating and rinsing agents and which was used in a commercially available cleaner that was modified in the manner described below. The cleaning composition comprised 80 wt % of solvating agent and 20 wt % of rinsing agent. The solvating agent was a terpene-based composition that was comprised predominately of d-limonene and that is sold under the trademark BIOACT 121 by Petroferm Inc. The rinsing agent was perfluorohexane. The cleaner that was used was an electrically heated, water cooled piece of equipment sold by Detrex Chemical Industries, Inc., as model 2D 12-EW solvent cleaner (hereafter "the Detrex cleaner"). The Detrex cleaner has a compartment for holding and heating the cleaning composition comprising the solvating and rinsing agents and a compartment for holding the rinsing agent. The Detrex cleaner was modified to include means for agitating the cleaning composition and the rinsing composition, such means consisting of a pump which withdrew the cleaning composition from the bottom of the compartment in which it was held and which pumped the cleaning composition back into the main body thereof through nozzles. The compartment holding the rinsing agent was modified in the same way to achieve agitation of the body of rinsing agent in the compartment holding it. The Detrex cleaner comes equipped with a vapor zone that includes cooling coils. The Detrex cleaner was modified to include an additional set of cooling coils that were placed above the original equipment coils and which were cooled to −20° F. by means of a refrigerating system. The additional cooling coils were used to minimize evaporative losses of the rinsing agent. It should be appreciated that the present invention can be used effectively with other types of cleaning equipment that are available commercially or that can be modified readily to accommodate the practice of the present invention.

What is claimed is:

1. A process for removing soil from a substrate in a cleaning environment which comprises:
    (A) a boiling liquid cleaning composition which has a vapor space above it and which consists essentially of:
        (1) a solvating agent having a room-temperature vapor pressure of no greater than about 8 mm Hg and a solvating strength of no less than about 10; and
        (2) a rinsing agent having a room temperature vapor pressure of about 80 to about 760 mm Hg and an ozone depletion factor of no greater than about 0.15;
    wherein the composition boils at a relatively constant temperature, wherein the rinsing agent has a higher specific gravity than that of the solvating agent, and wherein the ratio of the vapor pressure of said rinsing agent to the vapor pressure of said solvating agent is at least about 100 and such that, at the boiling temperature of the composition, the vapor space above the boiling composition consists essentially of said rinsing agent and is substantially free of said solvating agent;

(B) a liquid rinse composition which consists essentially of said rinsing agent in liquid form and which is cool relative to said boiling liquid cleaning composition; and (C) vapor which: (1) overlies said boiling liquid cleaning composition and said relatively cool liquid rinse composition; (2) consists essentially of said rinsing agent; and (3) is substantially free of said solvating agent;

sequentially treating a soil-bearing substrate to clean the substrate and dry it by:

(i) placing the soil-bearing substrate in the vapor overlying said boiling liquid cleaning composition, immersing said substrate in the boiling liquid cleaning composition, and maintaining the substrate therein until soil is dissolved therefrom;

(ii) withdrawing the substrate having soil removed therefrom from the boiling liquid cleaning composition, the withdrawn substrate having on its surface residual material comprising solvating agent;

(iii) contacting the withdrawn substrate having thereon residual material with said vapor;

(iv) immersing the substrate having thereon residual material into said relatively cool liquid rinse composition to remove therefrom residual material;

(v) withdrawing the substrate from said relatively cool liquid rinse composition and contacting the withdrawn substrate with vapor which overlies the relatively cool liquid rinse composition, a portion of the vapor condensing on the withdrawn substrate; and (vi) removing the substrate from the vapor.

2. A process according to claim 1 in which: the solvating agent is selected from the group consisting of a terpene, a dibasic ester, a monobasic ester, a petroleum solvent, an alkyl substituted 2-pyrrolidone, a ketone, an ether, an alcohol, and an amine, and a mixture of two or more of said solvating agents; and the rinsing agent is selected from the group consisting of a hydrofluorocarbon, a fluorocarbon, an aliphatic hydrocarbon, an aromatic hydrocarbon, an alcohol, a ketone, and an ether, and a mixture of two or more of said rinsing agents.

3. A process according to claim 1 or 2 wherein the rinsing agent and solvating agent are miscible with each other.

4. A process according to claim 3 wherein the solvating agent comprises a monobasic ester or a dibasic ester.

5. A process according to claim 3 wherein the rinsing agent consists essentially of a hydrofluorocarbon.

6. A process according to claim 3 wherein the solvating agent comprises an ether.

7. A process according to claim 3 wherein the rinsing agent consists essentially of an ether.

8. A process according to claim 4 wherein the rinsing agent consists essentially of a hydrofluorocarbon.

9. A process according to claim 4 wherein the rinsing agent consists essentially of an ether.

10. A process according to claim 6 wherein the rinsing agent consists essentially of an ether.

11. A process according to claim 3 wherein the solvating agent comprises a petroleum solvent.

12. A process according to claim 11 wherein the rinsing agent consists essentially of a hydrofluorocarbon.

13. A process according to claim 7 wherein the solvating agent comprises a petroleum solvent.

14. A process according to claim 1 or 2 wherein the solvating strength of the solvating agent is at least about 20, the vapor pressure of the rinsing agent is about 80 to about 680 mm Hg, and the ozone depletion factor of the rinsing agent is no greater than about 0.05.

15. A process according to claim 1 or 2 wherein the solvating strength of the solvating agent is at least about 20, the vapor pressure of the rinsing agent is about 80 to about 680 mm Hg, the ozone depletion factor of the rinsing agent is no greater than about 0.05, and wherein the ratio of the vapor pressure of the rinsing agent to the vapor pressure of the solvating agent is no less than about 200.

16. A process according to claim 14 wherein the ozone depletion factor of the rinsing agent is 0.

17. A process according to claim 15 wherein the ozone depletion factor of the rinsing agent is 0.

18. A process according to claim 14 wherein the rinsing agent and solvating agent are miscible with each other.

19. A process according to claim 15 wherein the rinsing agent and solvating agent are miscible with each other.

20. A process according to claim 16 wherein the rinsing agent and solvating agent are miscible with each other.

21. A process according to claim 17 wherein the rinsing agent and solvating agent are miscible with each other.

* * * * *